United States Patent
Le Royer et al.

(10) Patent No.: US 12,477,958 B2
(45) Date of Patent: Nov. 18, 2025

(54) METHOD FOR MAKING AN ELECTRONIC DEVICE WITH SUPERCONDUCTOR QUBIT(S) INCLUDING AT LEAST ONE JoFET

(71) Applicant: COMMISSARIAT A L'ENERGIE ATOMIQUE ET AUX ENERGIES ALTERNATIVES, Paris (FR)

(72) Inventors: Cyrille Le Royer, Grenoble (FR); Fabrice Nemouchi, Grenoble (FR); Nicolas Posseme, Grenoble (FR); Sébastien Kerdiles, Grenoble (FR); François Lefloch, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 417 days.

(21) Appl. No.: 18/304,531

(22) Filed: Apr. 21, 2023

(65) Prior Publication Data
US 2024/0341201 A1 Oct. 10, 2024

(30) Foreign Application Priority Data
Apr. 26, 2022 (FR) ..................... 22 03899

(51) Int. Cl.
*H10N 60/01* (2023.01)
*H10N 60/10* (2023.01)

(52) U.S. Cl.
CPC ....... *H10N 60/0912* (2023.02); *H10N 60/128* (2023.02)

(58) Field of Classification Search
CPC .. H10N 60/0912; H10N 60/128; H10N 60/12; H10N 69/00
See application file for complete search history.

(56) References Cited

U.S. PATENT DOCUMENTS

| 2020/0161422 A1 | 5/2020 | Nemouchi et al. |
| 2021/0226114 A1 | 7/2021 | Holmes et al. |

(Continued)

FOREIGN PATENT DOCUMENTS

| FR | 3 088 483 A1 | 5/2020 |

OTHER PUBLICATIONS

French Preliminary Search Report issued Dec. 13, 2022, in French Application 22 03899 filed on Apr. 26, 2022, 3 pages (with English Translation of Categories of Cited Documents).

(Continued)

*Primary Examiner* — Matthew L Reames
(74) *Attorney, Agent, or Firm* — Oblon, McClelland, Maier & Neustadt, L.L.P.

(57) ABSTRACT

A method for making a device with superconductor qubit(s) including at least one JoFET formed by the following steps of:
  making, over a semiconductor layer, a protective dielectric portion arranged over a first region of the semiconductor layer;
  implanting dopants in second regions adjacent to the first region;
  depositing a protective dielectric layer covering the protective dielectric portion and the second regions;
  exposing the protective dielectric layer to a laser pulse;
and wherein the materials and the thicknesses of the protective dielectric portion and of the protective dielectric layer are selected so as to prevent the laser pulse from reaching the first region, and melting the semiconductor of the second regions which forms, after cooling, a recrystallised semiconductor material having superconductor material properties.

14 Claims, 12 Drawing Sheets

(56) References Cited

U.S. PATENT DOCUMENTS

2021/0296557 A1  9/2021  Holmes et al.
2021/0384405 A1  12/2021 Holmes et al.

OTHER PUBLICATIONS

Casparis et al., "Superconducting Gatemon Qubit based on a Proximitized Two-Dimensional Electron Gas", arxiv.org, Cornell University Library, 201 Olin Library Cornell University Ithaca, NY, 14853, Nov. 21, 2017, 6 pages.

Daubriac et al., "Superconducting Polycrystalline Silicon Layer Obtained by Boron Implantation and Nanosecond Laser Annealing", ECS Journal of Solid State Science and Technology, vol. 10, No. 1, Jan. 25, 2021, 8 pages.

METHOD FOR MAKING AN ELECTRONIC DEVICE WITH SUPERCONDUCTOR QUBIT(S) INCLUDING AT LEAST ONE JoFET

TECHNICAL FIELD

The invention relates to the field of electronic devices with one or more superconductor qubit(s), and more particularly with gatemon-type qubit(s). Advantageously, the invention is applied in making such a device in a semiconductor layer.

PRIOR ART

In a superconductor qubit, the qubit takes on the form of the state of superconductor current that crosses a very thin barrier based on the Josephson effect. There are several types of superconductor qubits: flux, phase, or charge qubits. In these different types of qubits, a superposition of two distinct states of a current oscillating at high frequency and crossing the Josephson junction should be created in a superconductor loop. The oscillation is made possible by the fact that the loop integrates the equivalent of an inductance and of a resistance. The oscillation of the current is activated by the application of microwaves with frequencies between 5 and 10 GHz and transmitted through a conductive and physical route. The state of the qubit corresponds to the resonance phase of the current or to the direction of the current, measured by a magnetometer or by coupling with a microwave resonator In a gatemon-type qubit, the Josephson junction may be implemented by a Josephson field effect transistor, also called JoFET standing for "Josephson Field Effect Transistor" or JJ-FET standing for "Josephson Junction Field Effect Transistor". Such a transistor includes a gate arranged above a channel semiconductor region extending between superconductor source and drain regions.

A drawback related to making of this qubit type is that the superconductor regions are generally made from materials that are not compatible with the semiconductor technologies conventionally used in microelectronics.

DISCLOSURE OF THE INVENTION

Thus there is a need to provide a method for making an electronic device with superconductor qubit(s) including at least one JoFET, which could be implemented with techniques used in the semiconductors field.

For this purpose, one embodiment provides a method for carrying out an electronic device with superconductor qubit(s) including at least one JoFET formed by the implementation of the steps of:

making, over at least one semiconductor layer, at least one protective dielectric portion arranged over at least one first region of the semiconductor layer;
implanting dopants in second regions of the semiconductor layer, adjacent to the first region and such that the first region is arranged between the second regions;
depositing a protective dielectric layer covering at least the protective dielectric portion and the second regions;
exposing the protective dielectric layer to at least one laser pulse;
removing at least one portion of the protective dielectric layer covering the second regions;
removing the protective dielectric portion;
making at least one electrostatic control gate over the first region;
and wherein the materials and the thicknesses of the protective dielectric portion and of the protective dielectric layer, as well as the duration and the power of said at least one laser pulse, are selected such that the superposition of the protective dielectric portion and of the protective dielectric layer over the first region prevents said at least one laser pulse from reaching the first region, and that the presence of the protective dielectric layer alone over the second regions enables said at least one laser pulse to reach the second regions and melt the semiconductor of the second regions which forms, after cooling, a recrystallised semiconductor material having superconductor material properties.

Thus, this method suggests making an electronic device with one or more superconductor qubit(s) including one or more JoFET(s) made in a semiconductor layer. More particularly, the method suggests making the superconductor regions of the JoFET(s) by applying the principle of pulsed laser induced epitaxy or PLIE standing for "Pulsed Laser Induced Epitaxy", which consists in carrying out an implantation of dopants in the semiconductor material corresponding for example to silicon of a Bulk (massive) or SOI (silicon-on-insulator) substrate. Afterwards, the semiconductor material in which the implantation of dopants has been made is subjected to one or more laser pulse(s) making the semiconductor material melt. Cooling of the semiconductor material causes its recrystallisation which confers superconductor properties thereon.

In this method, at least one protective dielectric portion and one protective dielectric later are wisely selected and made so as to allow melting by laser pulse(s) the semiconductor in which the dopants are implanted to form superconductor regions, and at the same time protecting from the laser pulse(s) at least one first region of the semiconductor layer intended to form the junction between the superconductor regions.

The protective dielectric portion may include SiN, and the protective dielectric layer may include SiN and/or SiCO and/or $SiO_2$.

The protective dielectric portion may be made by firstly depositing a dielectric material layer over the semiconductor layer, then by etching this layer such that at least one remaining portion of this layer forms the protective dielectric portion.

The selection of the materials and of the thicknesses of the protective dielectric portion and of the protective dielectric layer may be carried out:

by selecting the material and the thickness of the protective dielectric layer such that the protective dielectric layer has a reflectivity, for the wavelength of said at least one laser pulse, lower than or equal to 10%, or lower than or equal to 15%, then by selecting the material and the thickness of the protective dielectric portion such that the superposition of the protective dielectric portion and of the protective dielectric layer has a reflectivity, for the wavelength of said at least one laser pulse, higher than or equal to 50%, or higher than or equal to 55%.

The method may be such that:
the protective dielectric layer is conformally deposited, and
the removal of at least one portion of the protective dielectric layer covering the second regions is carried out by implementing an anisotropic etching of the protective dielectric layer such that remaining portions of the protective dielectric layer form lateral dielectric spacers arranged against sidewalls of the protective dielectric portion.

The method may further include, between the making of the protective dielectric portion and the implantation of the dopants in the second regions:

conformal deposition of a second dielectric layer covering at least the protective dielectric portion and the second regions;

anisotropic etching of the second dielectric layer such that remaining portions of the second dielectric layer cover sidewalls of the protective dielectric portion and are arranged over the first region (and more specifically over edges of the first region);

a semiconductor epitaxy over the second regions;

and the deposited protective dielectric layer may also cover the remaining portions of the second dielectric layer.

The semiconductor formed by epitaxy completes the existing semiconductor of the second regions and is part of these second regions.

In the case hereinabove:

the protective dielectric layer may be conformally deposited, and the removal of at least one portion of the protective dielectric layer covering the second regions may be carried out by implementing an anisotropic etching of the protective dielectric layer, remaining portions of the protective dielectric layer forming, with the remaining portions of the second dielectric layer, lateral dielectric spacers arranged against sidewalls of the protective dielectric portion, or the removal of at least one portion of the protective dielectric layer may correspond to a total removal of the protective dielectric layer.

The method may further include, between the making of the protective dielectric portion and the implantation of the dopants in the second regions:

conformal deposition of a third dielectric layer covering at least the protective dielectric portion and the second regions, and whose thickness is equal at least to that of the protective dielectric layer formed subsequently;

anisotropic etching of the third dielectric layer such that remaining portions of the third dielectric layer cover sidewalls of the protective dielectric portion and are arranged over the first region (these remaining portions of the third dielectric layer then have a dimension, corresponding to the thickness of the third dielectric layer, which is equal to at least the thickness of the protective dielectric layer formed subsequently);

and may further include, between the implantation of the dopants in the second regions and the deposition of the protective dielectric layer, a removal of the remaining portions of the third dielectric layer.

In this case, the method may further include, between the removal of at least one portion of the protective dielectric layer covering the second regions and the removal of the protective dielectric portion, making of lateral dielectric spacers against remaining portions of the protective dielectric layer, and the making of the electrostatic control gate may be preceded by a removal of the remaining portions of the protective dielectric layer.

The semiconductor layer may correspond to a superficial layer of a semiconductor-on-insulator type, for example SOI (silicon-on-insulator) type, substrate.

In this case, the dopants may be implanted within all the thickness of the semiconductor layer, or the dopants may be implanted within only one portion of the thickness of the semiconductor layer.

The dopants may correspond to boron atoms implanted with a dose between $1.10^{16}$ and $9.10^{17}$ at/cm$^2$.

The method may further include, before the making of the protective dielectric portion, the making of isolation trenches through at least one portion of the thickness of the semiconductor layer, and the steps implemented afterwards may form several JoFETs electrically isolated from each other by the isolation trenches.

The implemented steps may form several JoFETs electrically coupled in series via second regions common to two of said JoFETs.

The method may further include the making, in the semiconductor layer, of devices with spin qubits and/or CMOS-type devices and/or at least one Andreev chain including other regions (i.e. distinct from the second regions) of a recrystallised semiconductor having superconductor material properties.

Throughout the document, the term "over" is used notwithstanding to the orientation in space of the element to which this term relates. For example, in the feature "over a face of the first substrate", this face of the substrate is not necessarily oriented upwards but could correspond to a face oriented according to any direction. Furthermore, the arrangement of a first element over a second element should be understood as possibly corresponding to the arrangement of the first element directly against the second element, without any intermediate element between the first and second elements, or as possibly corresponding to the arrangement of the first element over the second element with one or more intermediate element(s) arranged between the first and second elements.

Throughout the document, the term "layer" is used to refer to one layer alone, but also to a superposition of several distinct layers.

BRIEF DESCRIPTION OF THE DRAWINGS

The present invention will be understood upon reading the description of embodiments provided for purely indicative and non-limiting purposes with reference to the appended drawings wherein.

Identical, similar or equivalent portions of the different figures described hereinafter bear the same reference numerals so as to facilitate switching from one figure to another.

The different portions shown in the figures are not necessarily according to a uniform scale, in order to make the figures more readable.

The different possibilities (alternatives and embodiments) must be understood as not being mutually exclusive and can be combined with one another.

DETAILED DISCLOSURE OF PARTICULAR EMBODIMENTS

A first method for making an electronic device 100 with superconductor qubit(s) including at least one JoFET 102 is described hereinbelow in connection with FIGS. 1 to 11. In the example described in connection with these figures, the device 100, visible in FIG. 10, includes several JoFETs 102, and two of these JoFETs 102 are visible.

In this first method, the device 100 is made starting from a massive, or bulk, semiconductor substrate 104, herein silicon (other semiconductors are possible, like for example germanium or SiGe).

In a first step, STI ("Shallow Trench Isolation") type isolation trenches 106 are made in the substrate 104, delimiting the regions of the substrate 104 in which each of the JoFETs 102 will be made. The steps implemented to make the trenches 106 are similar to those conventionally implemented when making MOSFET transistors electrically isolated by such trenches.

Figure 1:
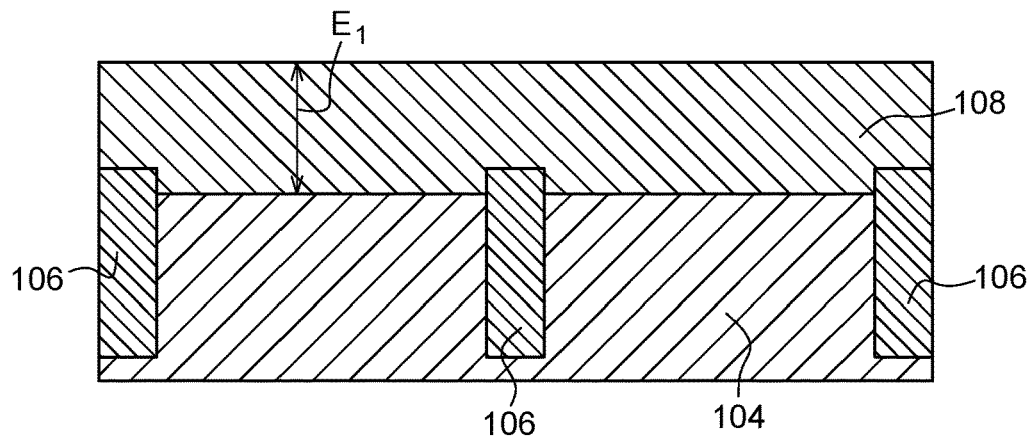
FIGS. 1 to 11 show a first method for making an electronic device with superconductor qubit(s) including at least one JoFET.
Figure 2:
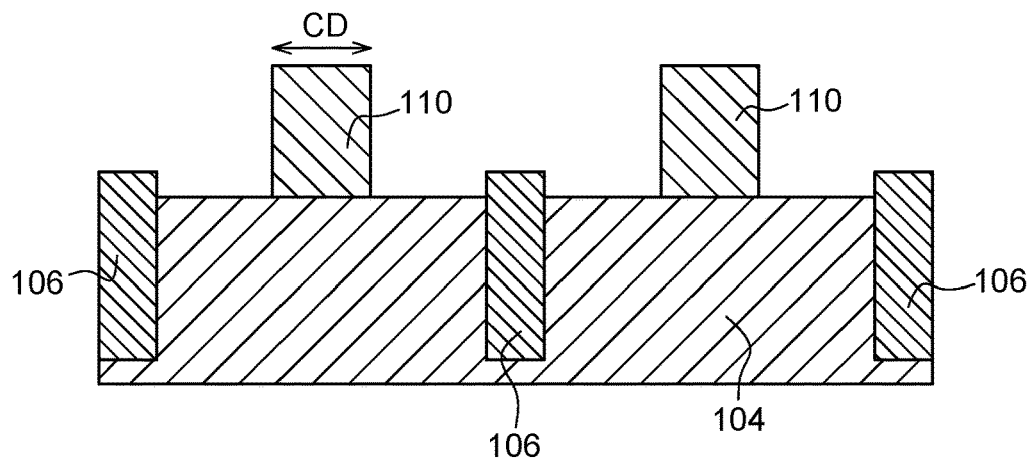
Figure 3:
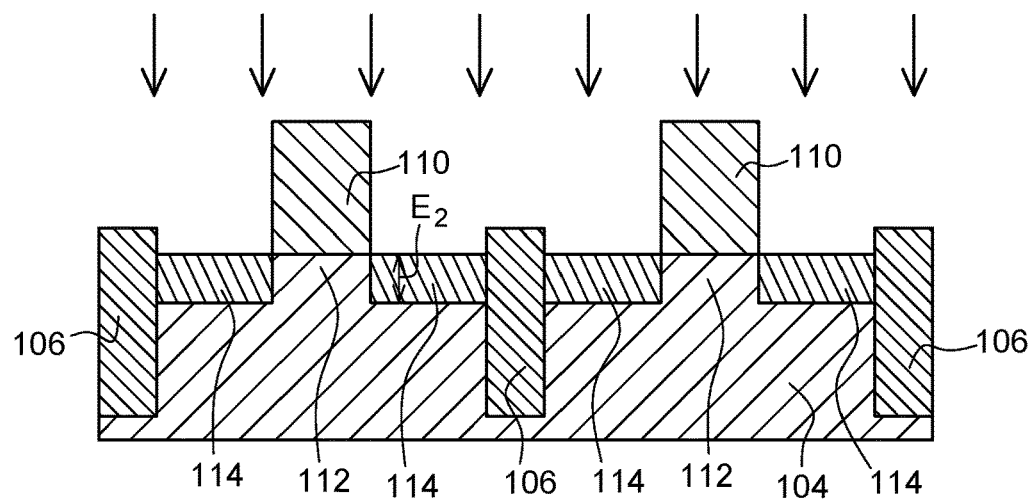

Afterwards, a dielectric material layer 108 is deposited over the substrate 104, while also covering the trenches 106 (cf. FIG. 1). In the embodiment described herein, the layer 108 includes SiN and its thickness $E_1$ is between 25 nm and 60 nm. The selection of the thickness and of the material of the layer 108 is described later on.

Afterwards, the layer 108 is etched so that remaining portions of this layer 108 form protective dielectric portions 110 that will subsequently serve in preserving the portions of the substrate 104 covered by these portions 110 with respect to an implantation of dopants and an exposure to a laser beam. These portions 110 also form dummy gates occupying, over the substrate 104, locations over which the gates of the JoFETs 102 will subsequently be made. These portions 110 have a critical dimension which will determine the gate length of the JoFETs 102. This critical dimension is denoted "CD" in FIG. 2 and is for example between 20 nm and 50 nm.

A cleaning step is implemented after making of the portions 110.

Afterwards, a step of implanting dopants is implemented through the surface of the substrate 104 over which the portions 110 rest. In the embodiment described herein, the implanted dopants are boron atoms. For example, the dose with which this implantation is implemented is between $1.10^{16}$ and $9.10^{17}$ at/cm². The energy with which this implantation is implemented is selected according to a desired thickness $E_2$ in which the doping atoms are implanted. For example, this thickness $E_2$ is between 5 nm and 25 nm. The arrows shown in FIG. 3 symbolically represent the direction of implantation of the doping atoms in the substrate 104.

During this implantation step, the regions of the substrate 104 covered by the portions 110, called first regions 112, are protected and the doping atoms are not implanted in these first regions 112. Thus, the thickness and the material of the layer 108 are selected so that the portions 110 obtained starting from this layer allow obtaining this protection.

On the contrary, the doping atoms are implanted in the regions of the substrate 104 not covered by the portions 110, called second regions 114. With this implantation, the semiconductor of the second regions 114 becomes amorphous. The thickness $E_2$ corresponds to the thickness of these second regions 114. In addition, with this implantation step, the sidewalls of the portions 110 are arranged right in front, or are aligned with, the edges of the second regions 114 and of the first regions 112. In the obtained structure shown in FIG. 3, two second regions 114 are adjacent to each first region 112 which is arranged between these two second regions 114.

After this implantation of dopants in the second regions 114, the structure may undergo a cleaning step again.

Figure 4:
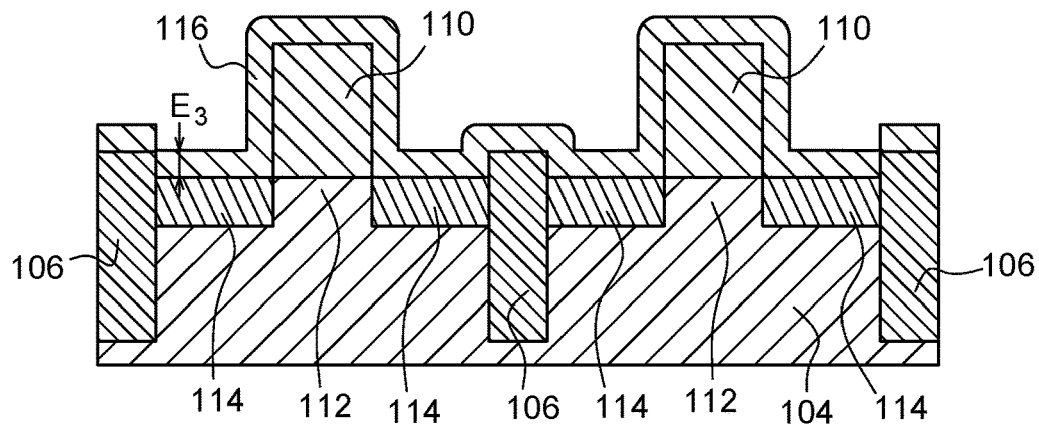
Figure 5:
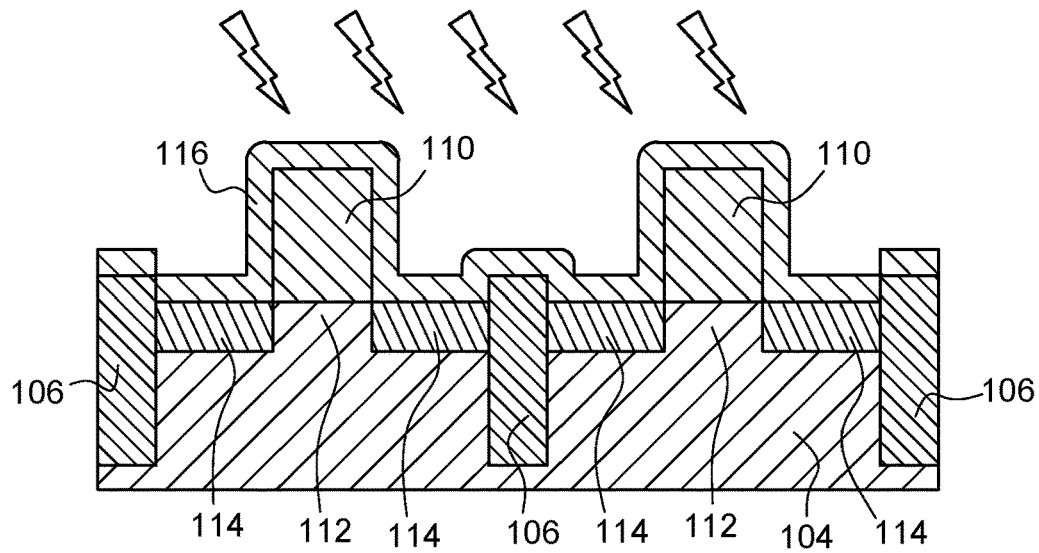
Figure 6:
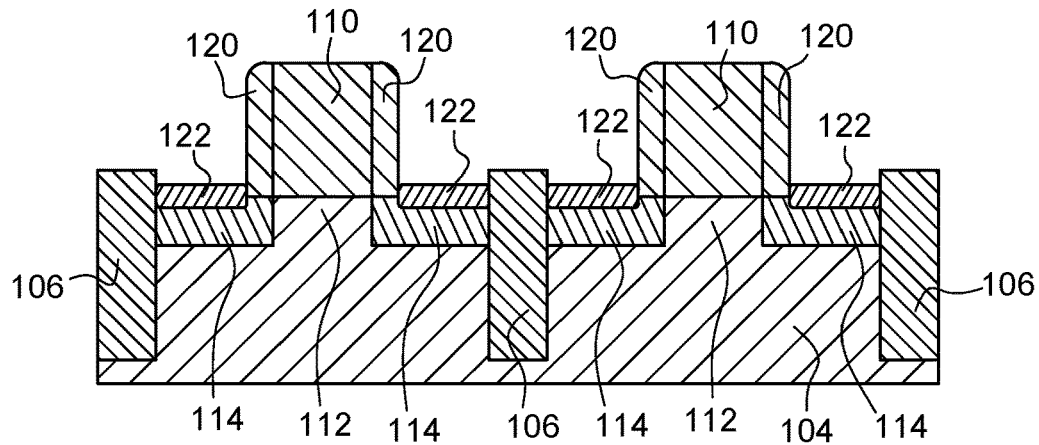
Figure 7:
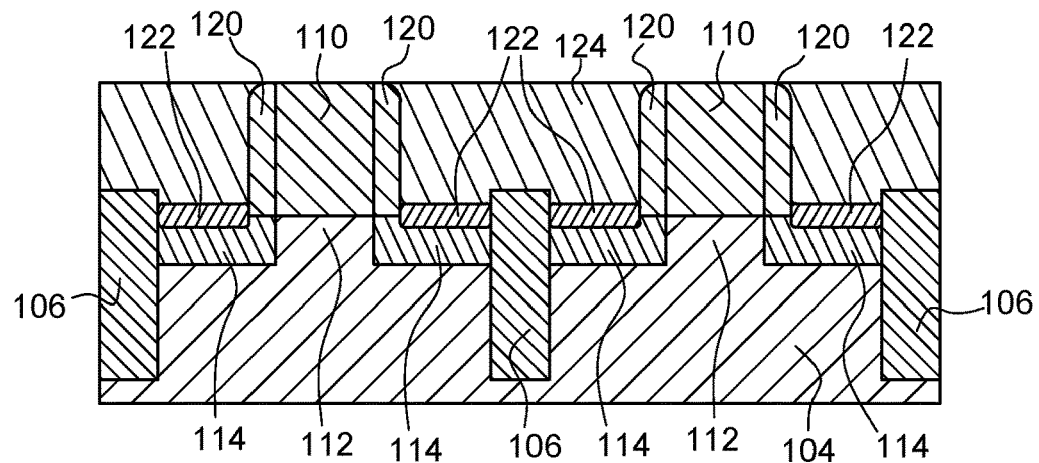

Afterwards, a protective dielectric layer 116 is conformally deposited over the entire structure, i.e. while covering the portions 110 (the upper faces and the sidewalls of the portions 110), the isolation trenches 106 and the second regions 114 (cf. FIG. 4). In the embodiment described herein, the layer 116 includes SiCO or $SiO_2$ or SiN, and its thickness $E_3$ is between 15 nm and 40 nm. The selection of the thickness and of the material of the layer 116 is done so that a subsequent step of exposing the completed structure to one or more laser pulse(s) makes the material of the second regions 114, which is covered only by the layer 116, melt but not the material of the first regions 112, which is covered by the portions 110 and the layer 116.

Afterwards, the completed structure is exposed to one or more laser pulse(s) which make the material of the second regions 114 melt. Using for example a laser emitting wavelengths in the ultraviolet domain, for example 193 nm, 248 nm, 308 nm or 355 nm, the duration of the pulses may typically be between about 20 ns and 200 ns, preferably between about 60 ns and 180 ns. The associated energy density ranges are then typically between about 0.1 and 2 J/cm², more particularly between about 0.3 and 1.5 J/cm². It should be noted that for the same result, a lower density will be necessary if the pulse duration is short. After having been exposed to the laser pulse(s) (for example a dose between 0.6 and 2 J/cm², for a laser with a wavelength equal to 308 nm), the molten amorphous semiconductor of the second regions 114 recrystallises, after cooling, into a semiconductor material having superconductor material properties. In the embodiment described herein, the recrystallised material corresponds to Si:B which has superconductor properties when the boron atom percentage is higher than about 4 or 5%. Furthermore, depending on the nature of the implanted material located beneath the second regions 114 (semiconductor in the case of a bulk substrate, or an oxide buried in the case of a FDSOI substrate), the recrystallised semiconductor of the second regions 114 is polycrystalline or monocrystalline.

During the exposure of the structure to the laser pulse(s), the superposition of the portions 110 and of the layer 116 prevents the used laser beam from penetrating up to the first regions 112. Hence, the semiconductor of the first regions 112 is not modified by the laser used to confer superconductor properties on the semiconductor of the second regions 114.

Afterwards, the layer 116 is anisotropically etched in order to suppress the portions of the layer 116 located over the isolation trenches 106, the second regions 114 and over the tops of the portions 110, while preserving portions 120 of the layer 116 covering the sidewalls of the portions 110 and which are intended to form the lateral spacers around the future gates of the JoFETs 102.

Alternatively, and in particular when the material of the layer 116 is not suited to form the desired lateral spacers, it is possible to completely etch the layer 116, then deposit one or more new layer(s) of materials over the entire structure, then anisotropically etch this or these new layer(s) of materials in order to preserve only the portions of this or these new layer(s) covering the sidewalls of the portions 110 and forming the future lateral spacers of the gates of the JoFETs 102.

Afterwards, a silicidation of the second regions 114 is implemented. For example, this silicidation is implemented using nickel. The presence of the portions 120 allows obtaining a proper positioning of the obtained silicide portions 122 with respect to the future gates of the JoFETs 102, i.e. spaced apart by a non-zero distance from these future gates (cf. FIG. 6).

Afterwards, at least one other dielectric layer 124 is deposited over the entire structure. For example, this layer 124 includes $SiO_2$, or corresponds to a superposition of an oxide and of a so-called "low-k", or low-permittivity, dielectric material. The thickness of the layer 124 is larger than the thickness $E_1$ of the portions 110. Afterwards, a chemical-mechanical polishing with stop on the portions 110 is implemented (cf. FIG. 7).

Figure 8:
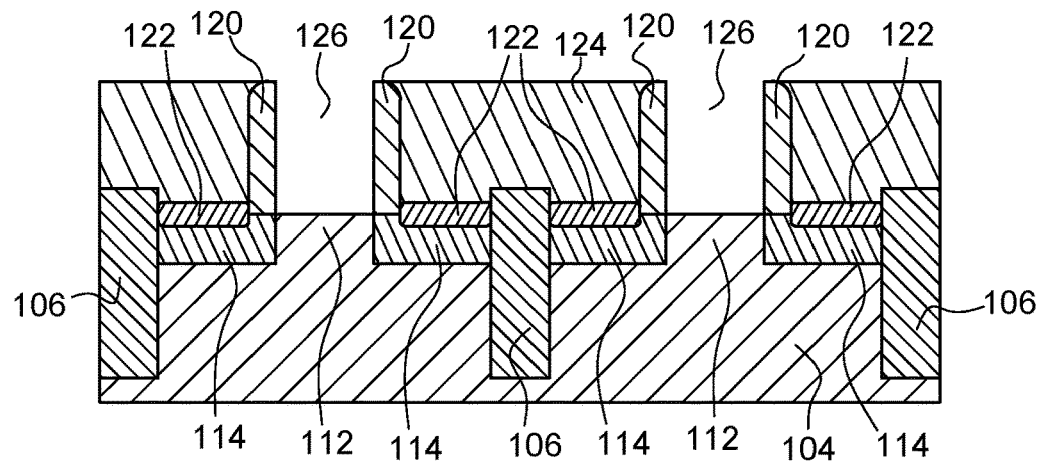

Afterwards, the portions 110 are removed by selective etching with respect to the materials of the portions 120 and of the layer 124 (cf. FIG. 8). In the embodiment described herein, this etching may correspond to a wet etching implemented with a $H_3PO_4$ solution allowing etching the SiN of the portions 110 selectively with respect to the $SiO_2$ or the SiCO of the portions 120 and the $SiO_2$ of the dielectric layer 124 or the Si (or SiGe) of the areas 112. The removal of the portions 110 forms empty spaces 126 surrounded by the portions 120.

Afterwards, the gates of the JoFETs 102 are made. For this purpose, a cleaning step is implemented, followed by a step of making at least one gate dielectric layer conformally deposited against the walls of the empty spaces 126 (bottom walls and lateral walls) and over the layer 124, then the deposition of one or more electrically-conductive material(s) in the remaining volume of the empty spaces 126 over the layer 124 with enough thickness to fill the remaining volume of the empty spaces 126. For example, the gate dielectric layer may correspond to a $SiO_2$ layer formed by thermal oxidation or by deposition, or a "High K", or high dielectric conductivity, dielectric material, like for example $HfO_2$. According to one example, the electrically-conductive materials deposited to form the gates of the JoFETs 102 correspond to a TiN layer covered by a thicker tungsten layer.

Figure 9:
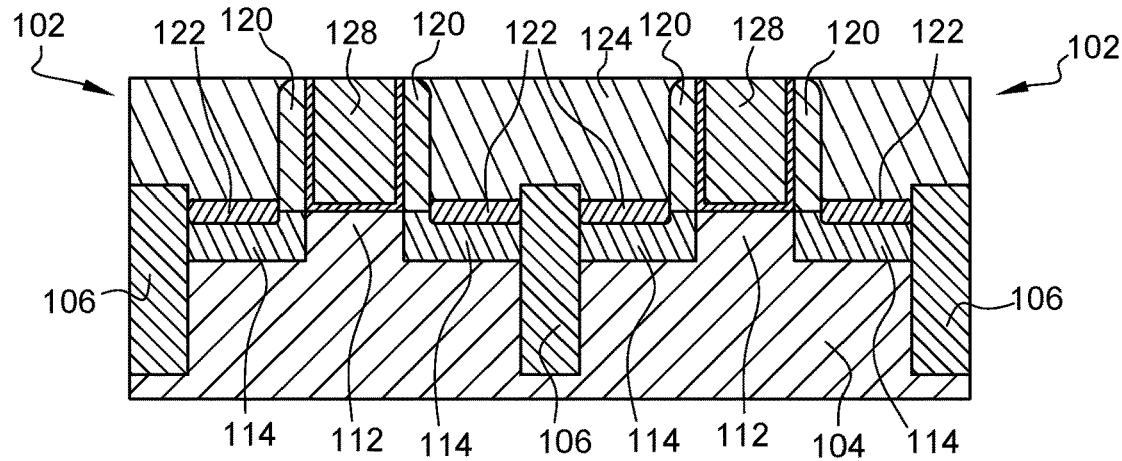

Afterwards, a chemical-mechanical polishing is implemented in order to suppress the portions of the gate dielectric layer and of the electrically-conductive materials located outside the empty spaces 126, thereby forming the gates 128 of the JoFETs 102, these gates 128 being located over the first regions 112 (cf. FIG. 9).

Figure 10:
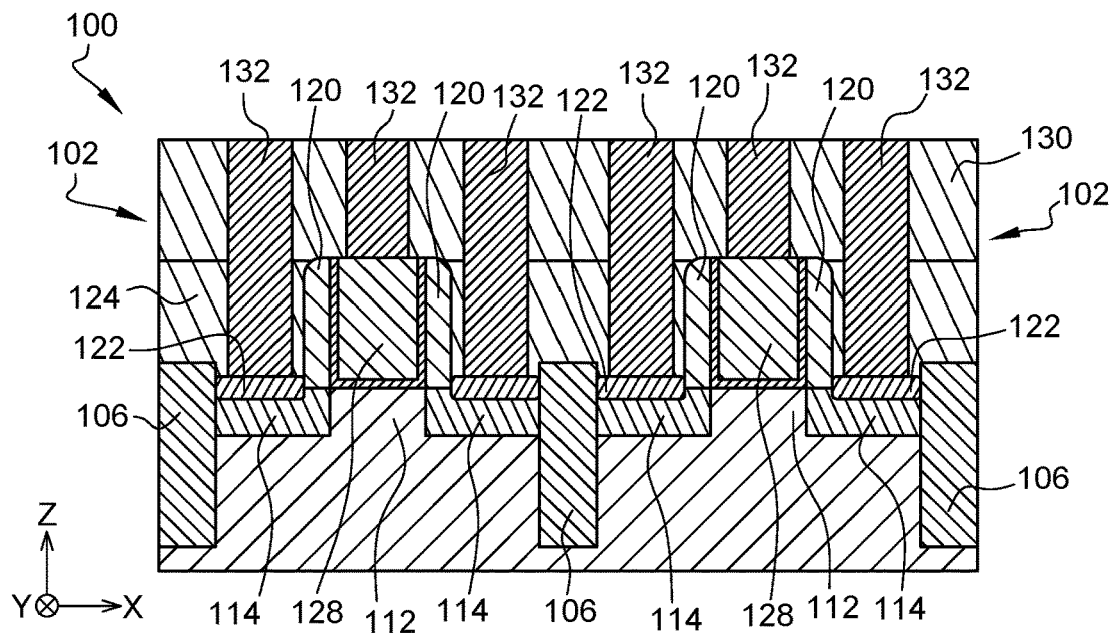
Figure 11:
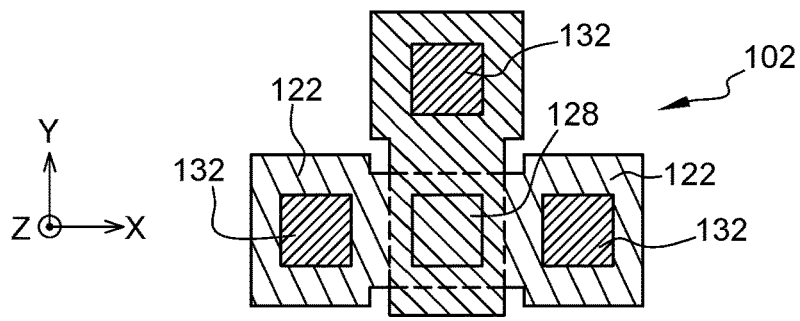

Making of the device 100 is completed by depositing at least one PMD (pre-metallic dielectric) dielectric layer 130, comprising for example $SiO_2$, over the entirety of the completed structure, then by etching contact holes through this layer 130, and also through the layer 124 for some of these holes. Afterwards, the etched holes are filled with one or more electrically-conductive material(s), forming electrical contacts 132 connected to the silicide portions 122 (these electrical contacts 132 cross the layers 124 and 130) and to the gates 128 (these electrical contacts 132 cross only the layer 130). The completed device 100 is shown in FIG. 10. A top view of one of the two JoFETs 102 of the device 100 is shown in FIG. 11.

Figure 12:
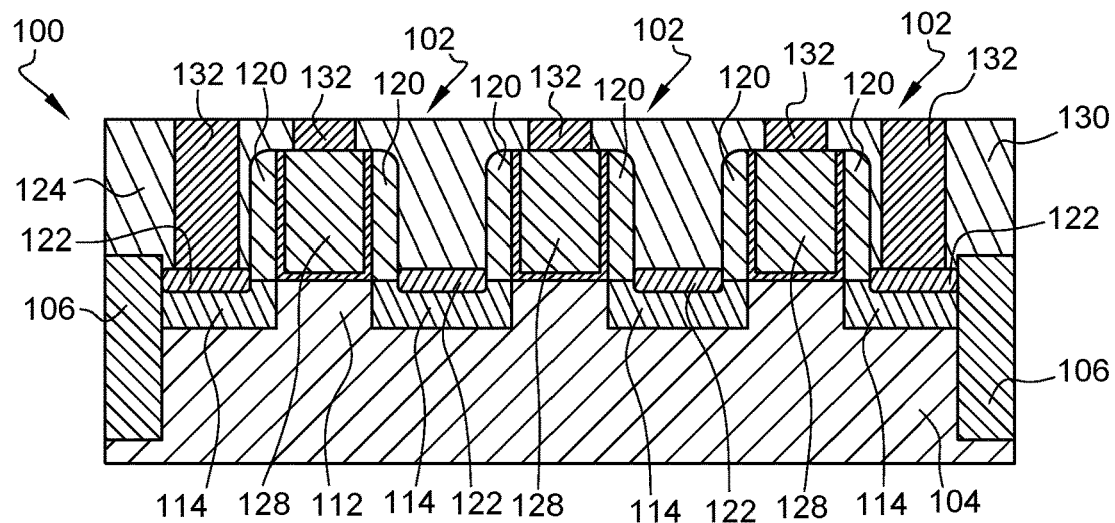
FIG. 12 shows a variant of an electronic device with superconductor qubit(s) including at least one JoFET.

In the previously-described exemplar method, the JoFETs 102 are electrically isolated from each other by the isolation trenches 106. Alternatively or in combination with these JoFETs 102, the steps of this method may make several JoFETs 102 electrically connected in series via second regions 114 which are common to two neighbouring JoFETs 102. Such a configuration is shown in FIG. 12 in which three JoFETs 102 electrically coupled together in series are shown. In the example of FIG. 12, no electrical contact is connected to the modified second portions 118 common to two neighbouring JoFETs 102.

As indicated before, prior to the implementation of the depositions of the layers 108 and 116, the thickness and the material of these layers 108 and 116 are selected so that the step of exposing the structure to one or more laser pulse(s) makes the material of the second regions 114, which is covered only by the layer 116, melt but not the material of the first regions 112, which is covered by the portions 110 of the layer 108 and the layer 116.

For this purpose, the thickness and the material of the layer 116 are first of all selected so that this layer has a low reflectivity, for example lower than or equal to about 15%, or lower than or equal to about 10%, for the wavelength of the laser used to make the semiconductor of the second regions 114 melt. According to a particular first embodiment, when the laser used to make the semiconductor of the second regions 114 melt has a wavelength equal to 308 nm, a low reflectivity for this laser is obtained with a layer 116 including SiN and a thickness $E_3$ between 25 nm and 35 nm, for example equal to 30 nm. According to a particular second embodiment, when the laser used to make the semiconductor of the second regions 114 melt also has a wavelength equal to 308 nm, the layer 116 may include $SiO_2$ and a thickness $E_3$ between 30 nm and 40 nm, for example equal to 35 nm.

After having selected the thickness and the material of the layer 116, the thickness and the material of the layer 108 are selected so that the superposition of the materials of the layers 108, 116 over the first regions 112 has a high reflectivity, for example higher than or equal to about 50%, or higher than or equal to about 55%, for the wavelength of the laser used to make the semiconductor of the second regions 114 melt and thus protects the first regions 112 so that the material of the first regions 112 does not melt when it is exposed to this laser. It should be noted that by selecting the thickness and the material of the layer 108 in this manner, the semiconductor of the first regions 112 is also preserved from the implantation of dopants implemented to obtain the second regions 114. According to the particular first embodiment indicated hereinabove, the layer 108 may also include SiN and a thickness $E_1$ between 25 nm and 45 nm. According to the particular second embodiment indicated hereinabove, the layer 108 may also include SiN and a thickness $E_1$ between 50 nm and 60 nm.

A second method for making an electronic device 100 with superconductor qubit(s) including at least one JoFET 102 is described hereinbelow in connection with FIGS. 13 to 23. In the example described in connection with these figures, the device 100 includes several JoFETs 102, and two of these JoFETs 102 are shown in these figures.

In this second method, the device 100 is made starting from a semiconductor-on-insulator, herein SOI (silicon-on-insulator), type substrate. Advantageously, this substrate is of the FDSOI (fully-deserted silicon-on-insulator, or fully-depleted silicon-on-insulator) type. This substrate includes a massive layer 134, or support layer, over which a buried dielectric layer 136, or BOX, is arranged. A semiconductor, herein silicon, superficial layer 138 is arranged over the buried dielectric layer 136. Advantageously, the thickness $E_4$ of the superficial layer 138 is smaller than or equal to about 12 nm, and possibly smaller than or equal to about 7 nm.

Like in the previously-described first making method, STI-type isolation trenches 106 are made in the substrate (through the layers 138 and 136, and a portion of the thickness of the layer 134), delimiting the regions of the substrate in which each of the JoFETs 102 will be made.

Figure 13:
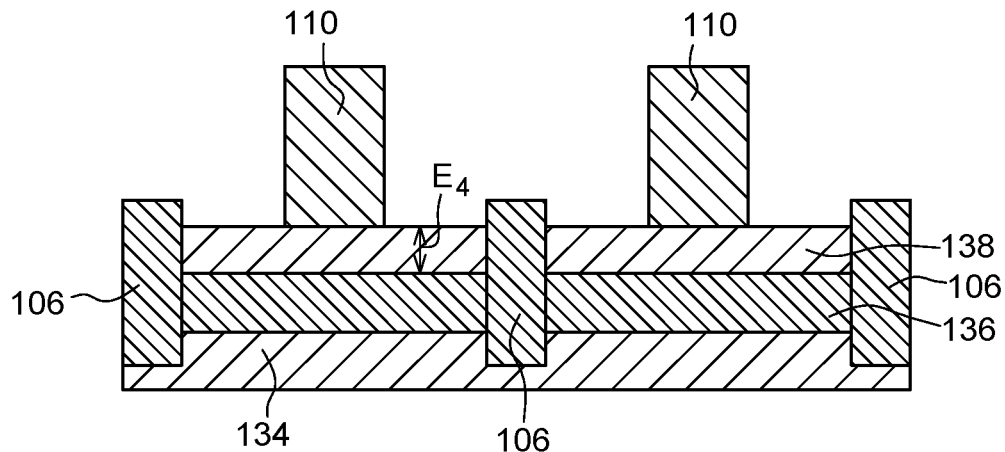
FIGS. 13 to 23 show a second method for making an electronic device with superconductor qubit(s) including at least one JoFET.
Figure 14:
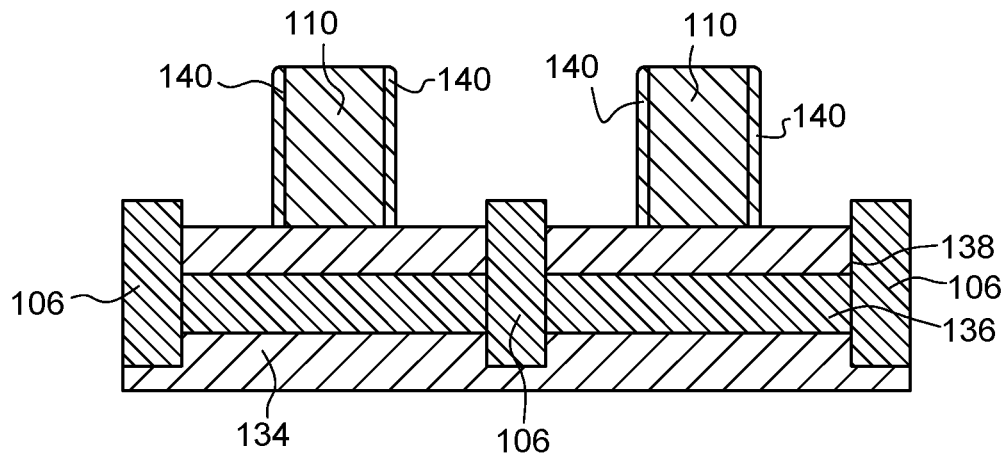

Afterwards, the dielectric material layer 108 is deposited over the substrate while also covering the trenches 106, then is etched afterwards so as to form the portions 110 which will serve in delimiting the first and second regions 112, 114 which will be obtained in the superficial layer 138 (cf. FIG. 13). For example, the layer 108 is similar to that one described before for the first making method. A cleaning step is implemented after making of the portions 110.

Afterwards, another dielectric layer, called for example second dielectric layer, comprising for example $SiO_2$, is conformally deposited over the entire structure, i.e. over the substrate, the trenches 106 and the portions 110 (upper and lateral walls). Afterwards, an anisotropic etching is implemented in order to preserve only remaining portions 140 of this second dielectric layer, these portions 140 covering the sidewalls of the portions 110 and being intended to form or to be part of the lateral spacers of the JoFETs 102 (cf. FIG. 14).

In the example described herein, wherein the substrate is of the FDSOI type, to obtain a proper operation of the device 100, the method is implemented such that the first regions 112 have a thickness different from that of the second regions 114. More particularly, for the gates 128 to be able to achieve a good electrostatic control of the conductivity of the first regions 112, these first regions 112 are made with a thickness smaller than or equal to about 12 nm, and possibly smaller than or equal to about 7 nm. On the contrary, for the second regions 114 to have good superconductor properties, the second regions 114 are made with a thickness larger than or equal to about 15 nm, or larger than or equal to about 20 nm.

Figure 15:
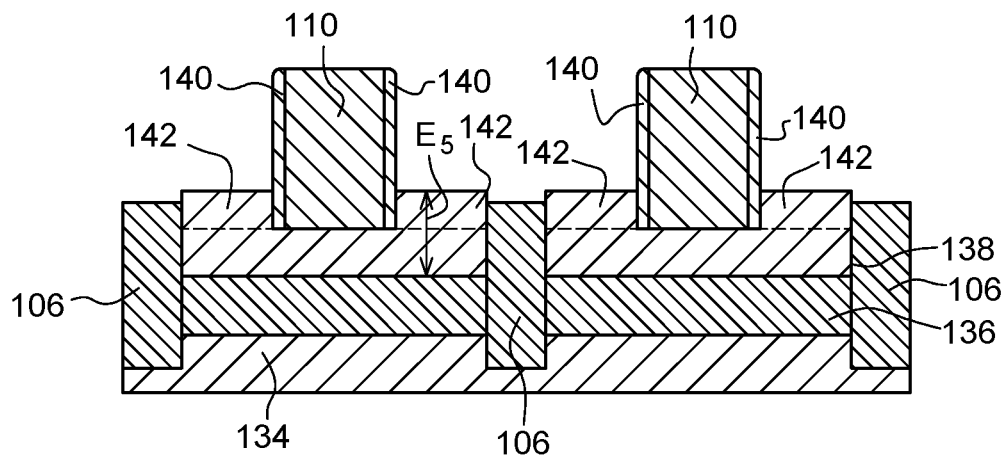

To obtain this difference in thickness between the first and second regions 112 and 114, a step of semiconductor (silicon in the example described herein) epitaxy is implemented in order to make this semiconductor grow in the portions of the layer 138 not covered by the portions 110 and 140 until reaching a thickness allowing obtaining subsequently second regions 114 having the desired superconductor properties. According to one embodiment, this epitaxy step is implemented so as to make a semiconductor thickness between about 5 nm and 25 nm grow, which enables the obtaining of a total semiconductor thickness $E_5$, at the level of the future semiconductor regions intended to be molten, between about 17 nm and 30 nm. In FIG. 15, the semiconductor obtained by the implementation of this growth step bears the reference 142. Because of the presence of the portions 140 around the portions 110, the semiconductor 142 is not in contact with the portions 110, which, upon completion of the method, will allow obtaining second regions 114 remote from the gates 128, i.e. which are not in contact with the gates 128.

A cleaning step is implemented after this epitaxy.

Like in the previously-described first method, a step of implanting dopants is implemented afterwards. The portions of the layer 138 covered by the portions 110 and 140 are protected and the doping atoms are not implanted in these portions of the layer 138 forming the first regions 112. On the contrary, the doping atoms are implanted in the second regions 114 of the layer 138 not covered by the portions 110 and 140. With this implantation step, the external lateral edges (those that are not in contact with the portions 110) of the portions 140 are arranged right in front, or are aligned with, the edges of the second regions 114 and of the first regions 112.

Figure 16:
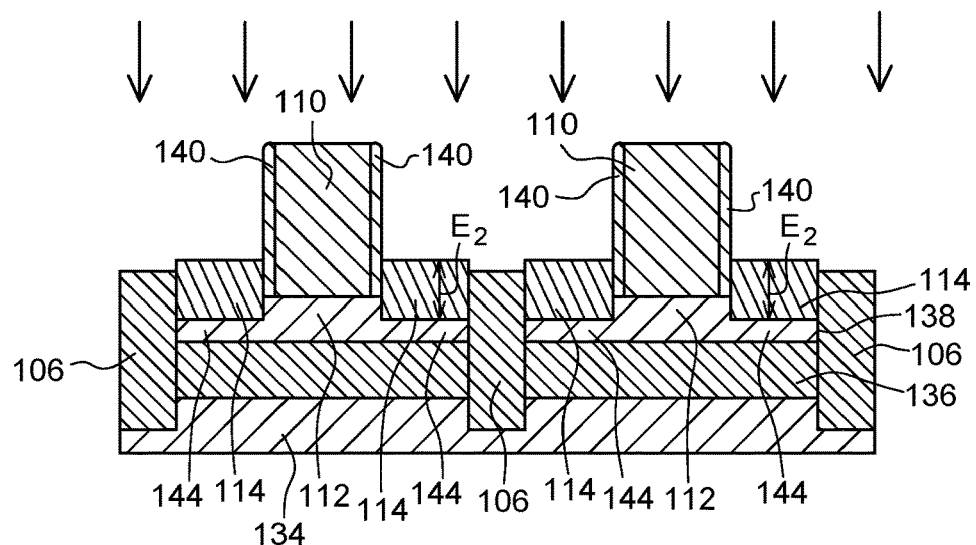
Figure 17:
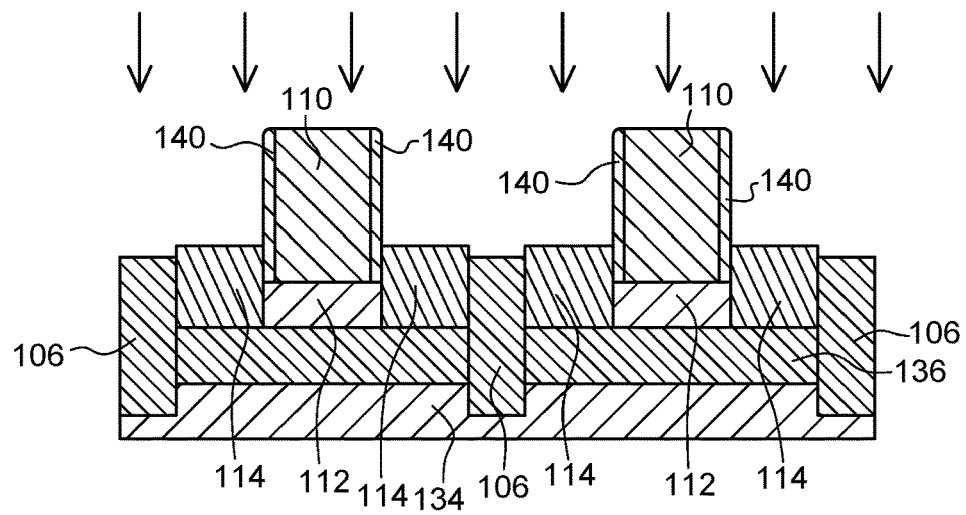
Figure 18:
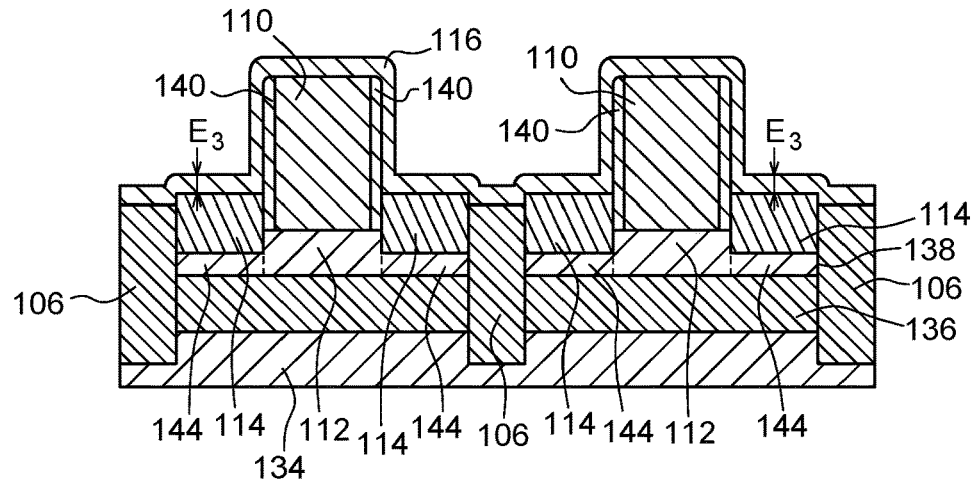

In the embodiment shown in FIG. 16, the doping atoms are not implanted all over the thickness of the layer 138. Thus, portions 144 of the layer 138 (symbolically delimited from the first regions 112 by dotted lines) present beneath the second regions 114 are preserved from the implantation of implemented dopants and will subsequently serve as a crystalline seed during the recrystallisation of the molten semiconductor of the second regions 114, which will enable the recrystallised semiconductor of the second regions 114 to be monocrystalline because of the monocrystalline nature of the semiconductor of the portions 144 of the layer 138 present beneath the second regions 114.

Alternatively, it is possible that the doping atoms are implanted all over the thickness of the layer 138. In this case, the second regions 114 extend from the surface of the layer 138 over which the portions 110 and 140 rest up to the buried dielectric layer 136 (cf. FIG. 17). In this case, the recrystallised material of the second regions 118 will be polycrystalline as the semiconductor recrystallises over the dielectric material of the layer 136.

The remaining of the method is described while considering that the next steps are implemented starting from the structure shown in FIG. 16, i.e. while having preserved the portions 144 of the layer 138 beneath the second regions 114. Nonetheless, these steps would be implemented identically if the dopants were implanted over the entire thickness of the layer 138.

After this implantation, the structure may undergo a cleaning step again. Afterwards, the protective dielectric layer 116 is conformally deposited over the entire structure, as described before for the first method. Like in the first method, the thickness $E_3$ and the material of the layer 116 are selected so that a subsequent step of exposing the completed structure to one or more laser pulse(s) makes the material of the second regions 114, which is covered only by the layer 116, melt but not the material of the first regions 112, which is covered by the portions 110, 140 and the layer 116. Alternatively, it is possible that the layer 116 is not conformally deposited, since because of the presence of the portions 140, portions of the layer 116 could be subsequently preserved or not to form, with the portions 140, the lateral spacers around the gates 128.

Figure 19:
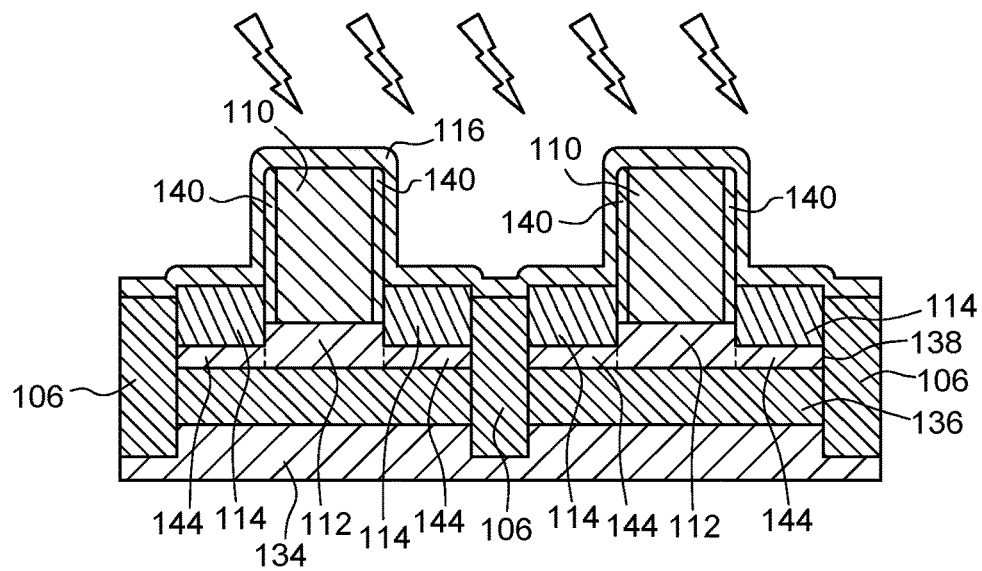

Afterwards, the completed structure exposed to one or more laser pulse(s) which make the material of the second regions 114 melt (cf. FIG. 19). After having been exposed to the laser pulse(s), the molten amorphous semiconductor of the second regions 114 recrystallises into a semiconductor material (herein monocrystalline because of the presence of the monocrystalline semiconductor portions 144 beneath the molten semiconductor of the second regions 114) having superconductor material properties.

Figure 20:
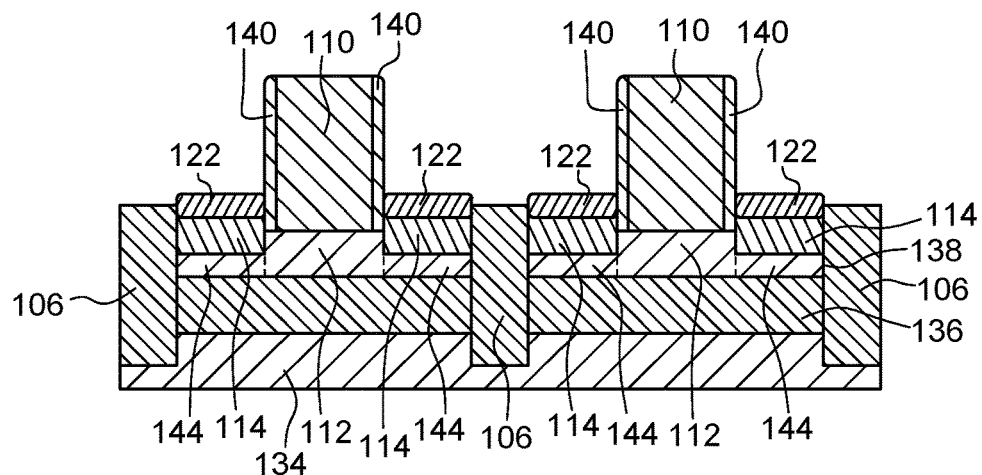

Afterwards, the layer 116 is etched either completely as shown in FIG. 20, or as previously described in the first method, i.e. while preserving portions of the layer 116 covering the sidewalls of the portions 110 and which are intended to form, with the portions 140, the lateral spacers around the future gates of the JoFETs 102. It is also possible to completely etch the layer 116, then deposit one or more new layer(s) of materials over the entire structure, then anisotropically etch this or these new layer(s) of materials in order to preserve only the portions of this or these new layer(s) covering the sidewalls of the portions 140 and forming, with the portions 140, the lateral spacers.

Like in the first method, a silicidation of the second regions 114 is implemented afterwards (cf. FIG. 20).

Figure 21:
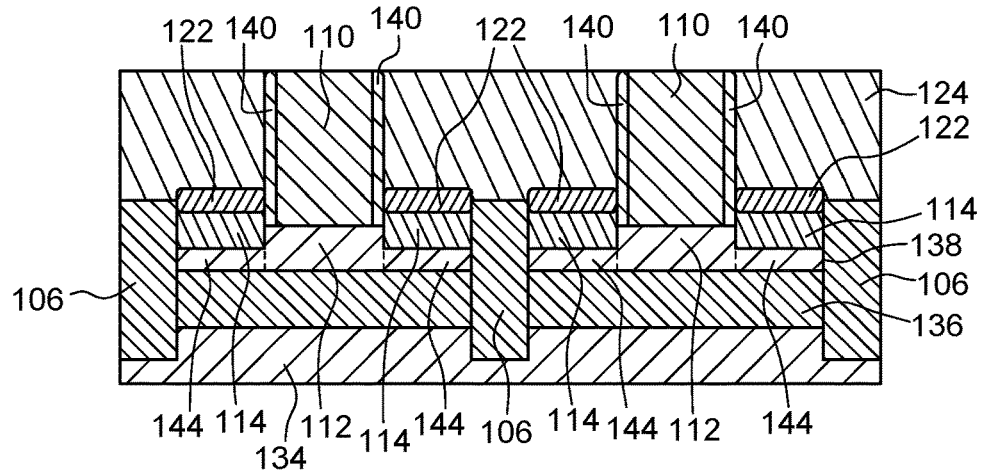

Afterwards, the dielectric layer 124 is deposited over the entire structure, then a chemical-mechanical polishing is implemented afterwards with stop on the portions 110 (cf. FIG. 21).

Figure 22:
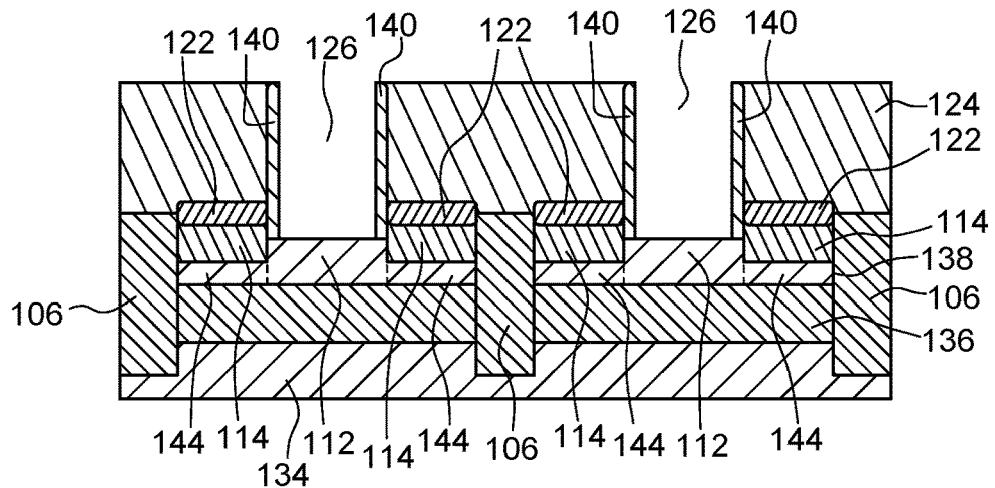

Afterwards, the portions 110 are removed by selective etching with respect to the materials of the lateral spacers, formed by the portions 140, and of the dielectric layer 124 (cf. FIG. 22). The removal of the portions 110 forms the empty spaces 126 surrounded by the portions 140.

Figure 23:
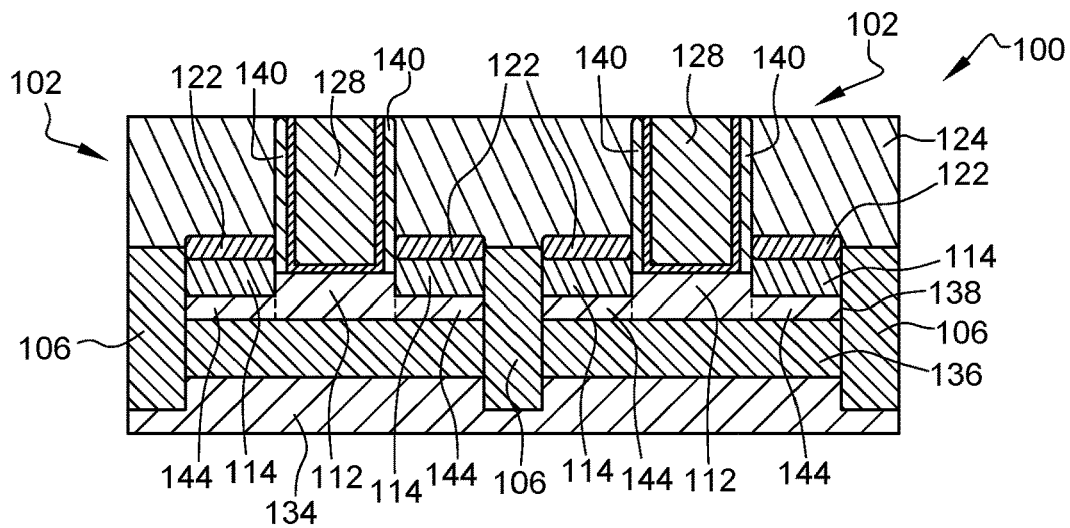

Like in the first method, the gates 128 of the JoFETs are made afterwards in the empty spaces 126 (cf. FIG. 23).

Making of the device 100 is completed like in the previously-described first method, i.e. by depositing at least one dielectric layer PMD over the entirety of the completed structure, by etching the contact holes and by filling these holes with one or more electrically-conductive material(s) to form the electrical contacts 132 connected to the silicide portions 122 and to the gates 128.

Like for the first method, this second method may be applied to make a device 100 including several JoFETs 102 electrically connected in series by their second regions 114 common to two neighbouring JoFETs 102.

A third method for making an electronic device 100 with superconductor qubit(s) including at least one JoFET 102 is described hereinbelow in connection with FIGS. 24 to 33. In the example described in connection with these figures, the device 100 includes several JoFETs 102, and two of these JoFETs 102 are shown in these figures.

Like in the first method, a bulk-type substrate 104 is used. The isolation trenches 106 are first made in the substrate 104, delimiting the regions of the substrate in which each of the JoFETs 102 will be made.

Figure 24:
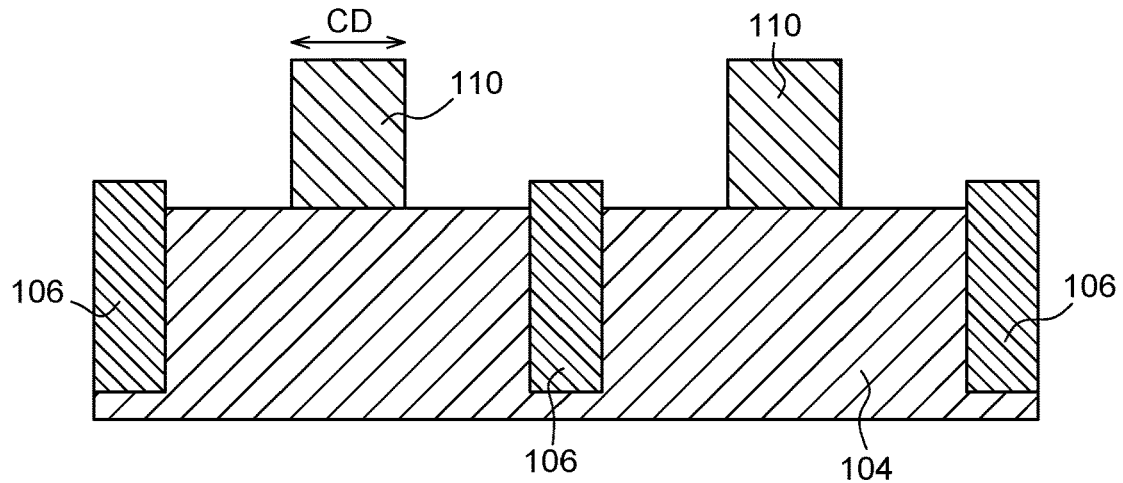
FIGS. 24 to 33 show a third method for making an electronic device with superconductor qubit(s) including at least one JoFET.
Figure 25:
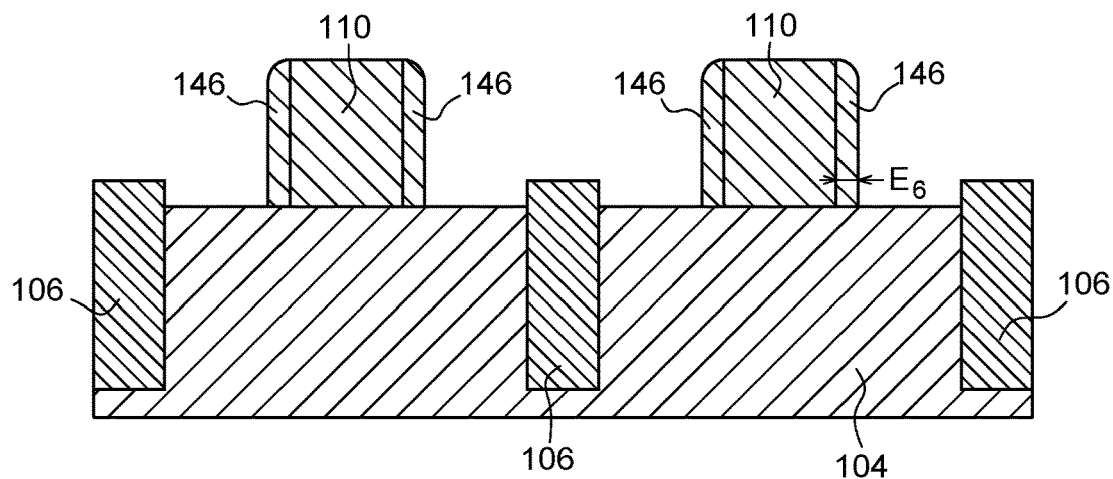
Figure 26:
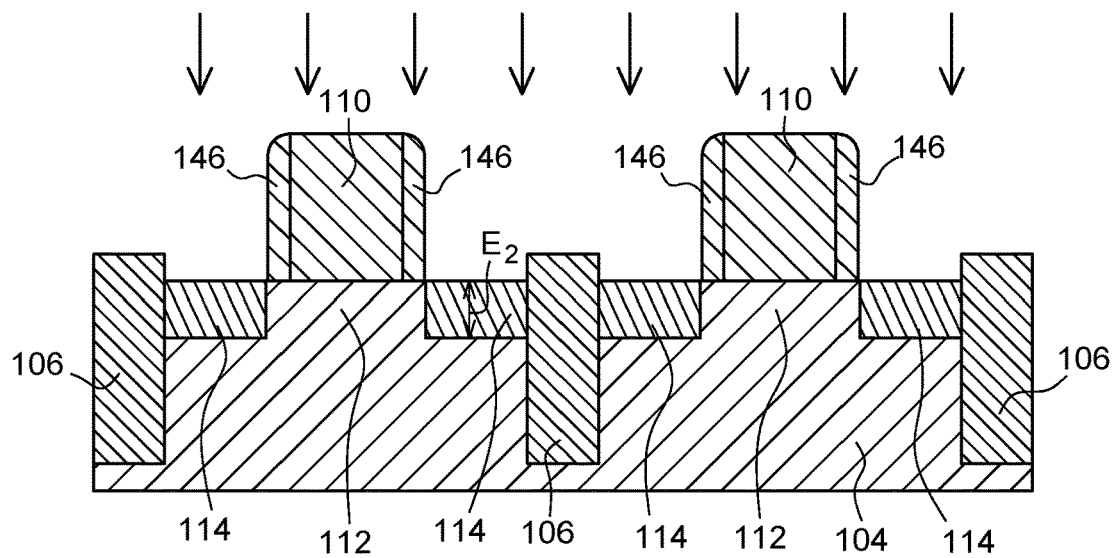

Afterwards, the layer 108 is deposited over the substrate 104 by also covering the trenches 106, then is etched afterwards so as to form the portions 110 intended to be arranged over the first regions 112 of the substrate 104 (cf. FIG. 24). For example, the layer 108 is similar to that one described before for the first and second making methods. A cleaning step is implemented after making of the portions 110.

Afterwards, a dielectric later, called for example third dielectric layer and comprising for example $SiO_2$, is conformally deposited over the entire structure, i.e. over the substrate 104, the trenches 106 and the portions 110 (upper and lateral walls). The thickness of this third dielectric layer is equal to at least that of the protective dielectric layer 116 which will be formed subsequently. Afterwards, an anisotropic etching is implemented in order to preserve only remaining portions 146 of this layer which cover the sidewalls of the portions 110 and which form temporary lateral spacers (cf. FIG. 25). The thickness $E_6$ of the remaining portions 146 of the deposited third dielectric layer is equal to that of the definitive lateral spacers intended to be made later on so that the portions 146 occupy, over the substrate 104, the locations that will be occupied later on by the definitive lateral spacers of the gates 128 of the JoFETs 102. This thickness $E_6$ is smaller than or equal to the initial thickness of the deposited third dielectric layer. Furthermore, this thickness $E_6$ is selected equal to the thickness $E_3$ of the protective dielectric layer 116 which will be subsequently used throughout the method. For example, this thickness $E_6$ is equal to about 15 nm.

A cleaning step is implemented after etching of the dielectric layer forming the portions 146.

Like in the previously-described first method, a step of implanting dopants is implemented afterwards. The first regions 112 of the substrate 104 covered by the portions 110 and 146 are protected and the doping atoms are not implanted in these first regions 112. On the contrary, the doping atoms are implanted in the second regions 114 of the substrate 104 not covered by the portions 110 and 146. With this implantation step, the external lateral edges (those that are not in contact with the portions 110) of the portions 146 are arranged right in front, or are aligned with, the edges of the second regions 114, and the internal lateral edges (those in contact with the portions 110) of the portions 146 are arranged right in front, or are aligned with, the edges of the first regions 112 (cf. FIG. 26).

Figure 27:
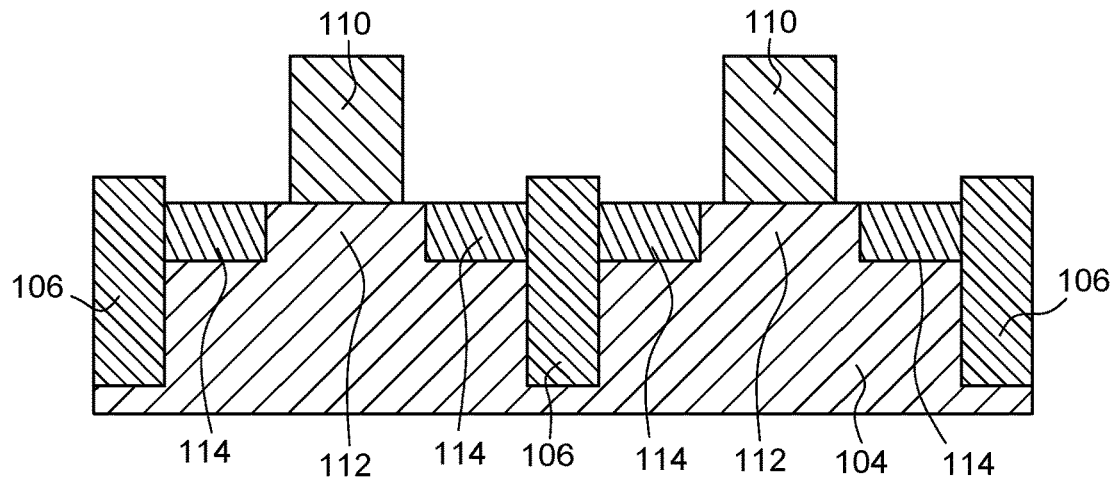
Figure 28:
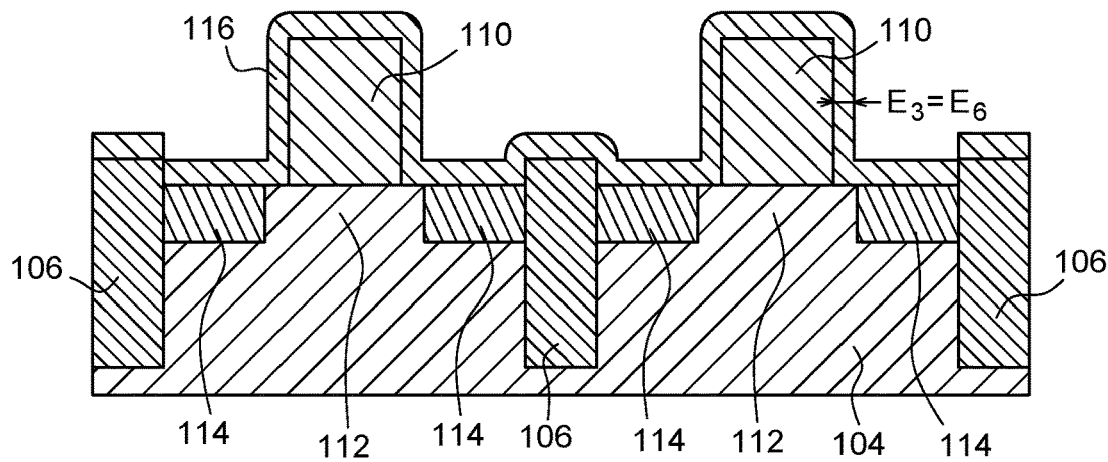
Figure 29:
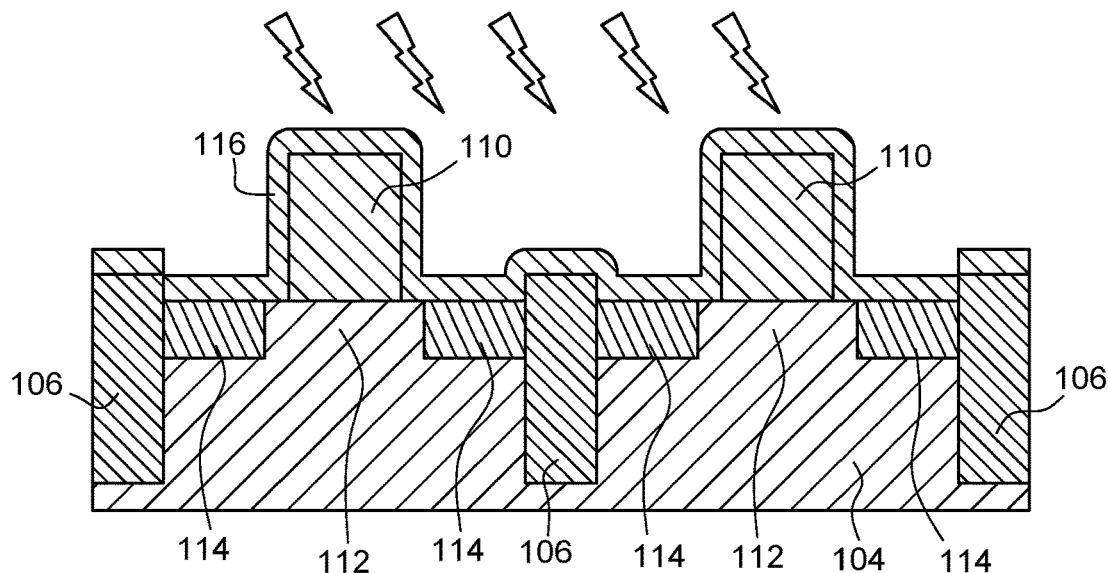

As shown in FIG. 27, the portions 146 are removed afterwards, for example by the implementation of a wet etching using a HF solution when these portions 146 include $SiO_2$.

After this implantation, the structure may undergo a cleaning step again. Afterwards, the layer 116 is conformally deposited over the entire structure, as previously described for the first and second methods (cf. FIG. 28). Like before, the thickness $E_3$ and the material of the second layer 116 are selected so that a subsequent step of exposing the completed structure to one or more laser pulse(s) makes the semiconductor of the second regions 114, which is covered only by the layer 116, melt but not the material of the first regions 112, which is covered by the portions 110 and the second layer 116.

Afterwards, the completed structure is exposed to one or more laser pulse(s) which make the semiconductor of the second region 114 (cf. FIG. 29) melt. After having been exposed to the laser pulse(s), the molten amorphous semiconductor of the second regions 114 recrystallises, after cooling, into a semiconductor material having superconductor material properties. The semiconductor of the first regions 112 covered beforehand by the portions 146 and which is covered only by the layer 116 is also protected from this or these laser pulse(s) by the large thickness of the material of the layer 116 present over these semiconductor portions.

Afterwards, the layer 116 is anisotropically etched so as to preserve portions of this layer 116 covering the sidewalls of the portions 110 and which are intended to form the lateral spacers around the future gates of the JoFETs 102. Alternatively, and as is the case in the example shown in FIG. 30, another material layer is deposited over the entire structure, then anisotropically etched in order to preserve only portions 148 of this or these new layer(s) covering the sidewalls of the portions 116 and intended to form the future lateral spacers of the gates 128 of the JoFETs 102.

Figure 30:
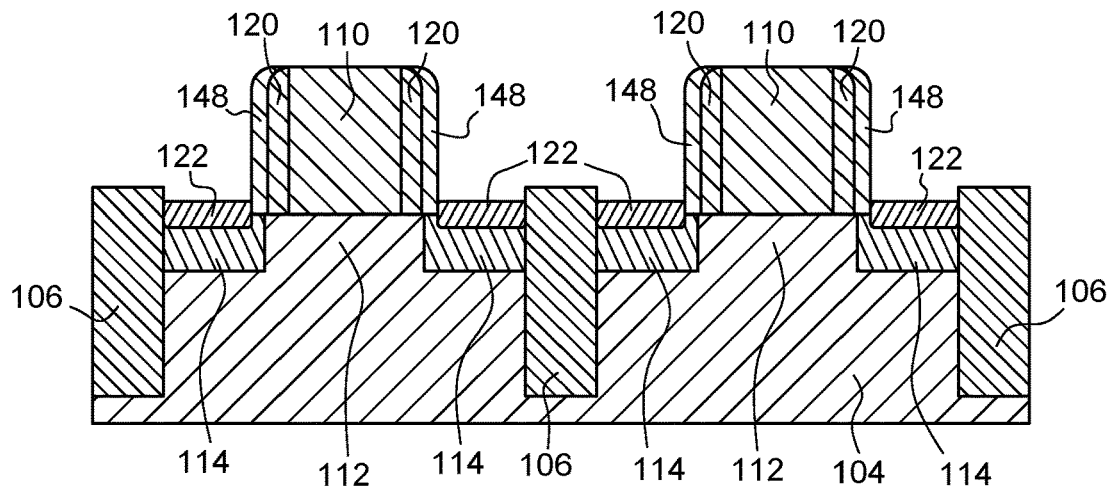

Like before, a silicidation of the second regions 114 is implemented afterwards (cf. FIG. 30).

Figure 31:
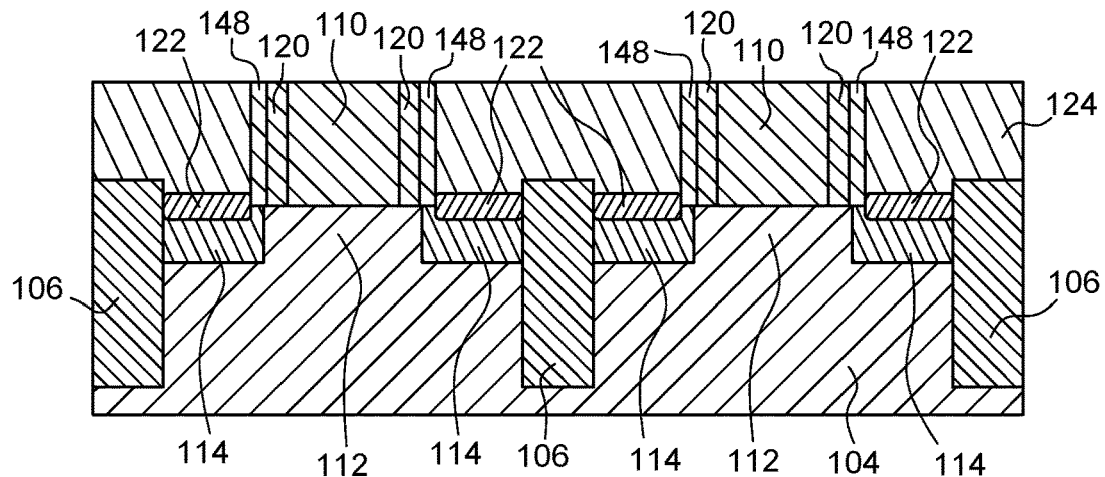

Afterwards, the dielectric layer 124 is deposited over the entire structure, then a chemical-mechanical polishing is implemented afterwards with stop on the portions 110 (cf. FIG. 31).

Figure 32:
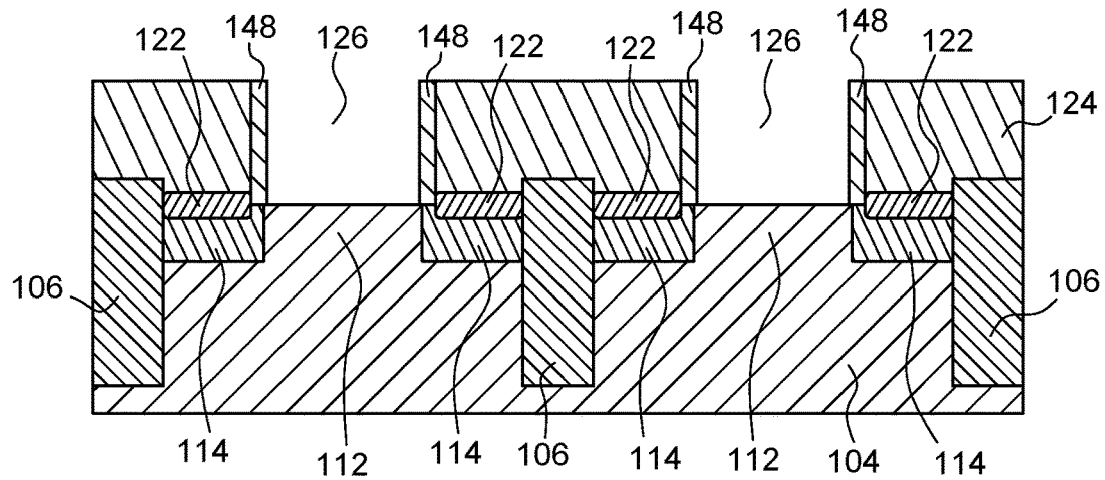

Afterwards, the portions 110 and 120 are removed by selective etching with respect to the materials of the lateral spacers, formed by the portions 148, and of the dielectric layer 124 (cf. FIG. 32). For example, this etching corresponds to a wet etching implemented with a $H_3PO_4$ solution when the portions 110 and 120 include SiN. The removal of the portions 110 and 120 forms the empty spaces 126 surrounded by the portions 148.

Figure 33:
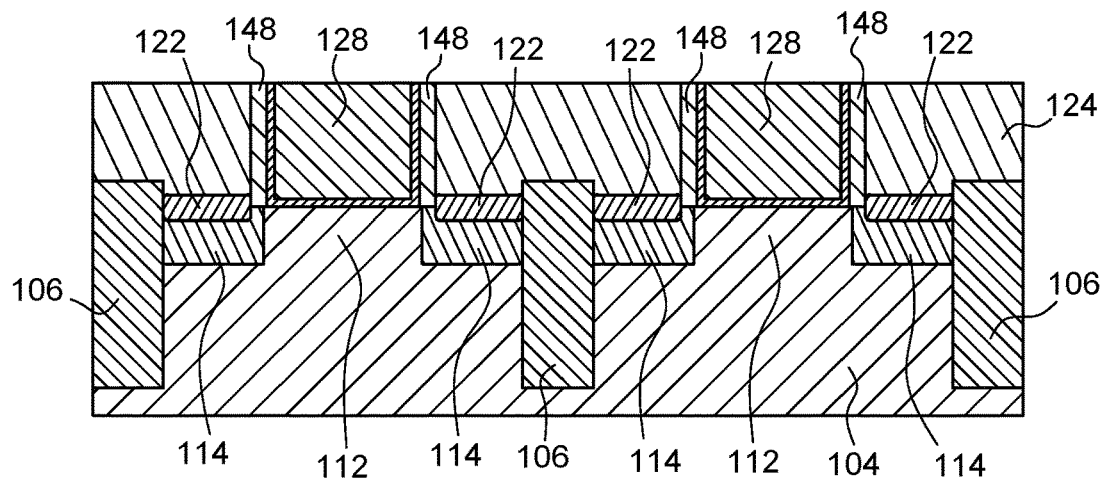

Like in the previous methods, the gates 128 of the JoFETs 102 are made afterwards in the empty spaces 126 (cf. FIG. 33).

Making of the device 100 is completed like in the previously-described first and second methods, i.e. by depositing at least one dielectric layer PMD over the entirety of the completed structure, by etching the contact holes and by filling these holes with one or more electrically-conductive material(s) to form the electrical contacts 132 connected to the silicide portions 122 and to the gates 128.

Like for the first method, this third method may be applied to make a device 100 including several JoFETs 102 electrically connected in series by their second regions 114 which are common to two neighbouring JoFETs 102.

Alternatively, this third method could be implemented starting from a semiconductor-on-insulator type substrate such as that one used in the previously-described second method, possibly by applying the different variants of implementations described before for the second method.

Regardless of the implemented method, the obtained device 100 is co-integrable, over the same substrate, with other types of devices of the semiconductors field.

Figure 34:
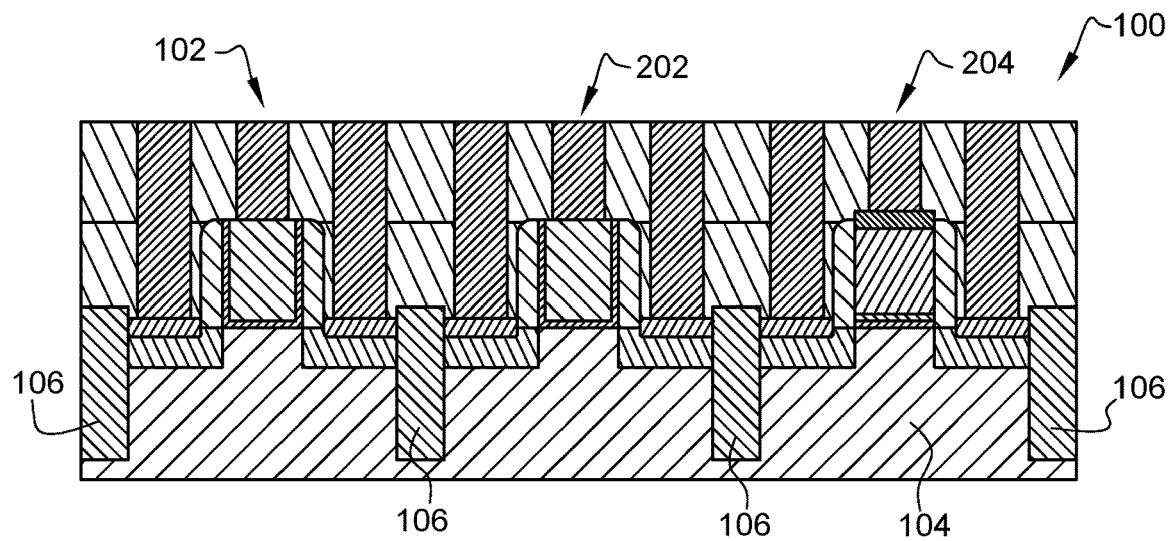
FIGS. 34 to 36 show different embodiments of electronic devices with superconductor qubit(s) integrated over a semiconductor substrate in which other types of semiconductor devices have been made.

For example, FIG. 34 shows a device 100 comprising one or more superconductor qubit(s) including at least one JoFET 102 (one single JoFET 102 is shown in FIG. 34) made in the semiconductor substrate 104, and also comprising CMOS-type devices, i.e. FET-type transistors. In FIG. 34, a "Gate Last" type transistor 202, i.e. whose gate has been made after making of the lateral spacers and removal of a temporary gate, and a "Gate First" type transistor 204, i.e. whose gate has been made by deposition of layers before the rest of the transistor, made in the substrate 104 are shown.

Figure 35:
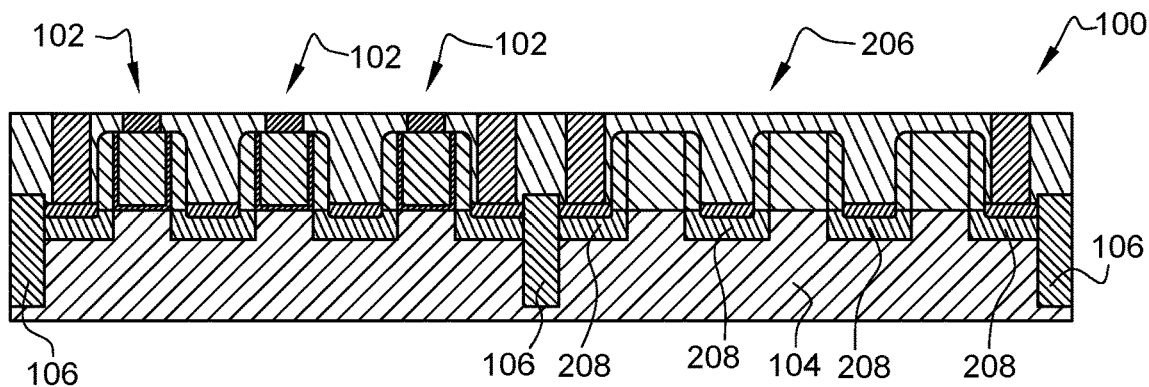

According to another example, FIG. 35 shows a device 100 comprising one or more superconductor qubit(s) including several JoFETs 102 electrically coupled in series by second regions 114 common to two of the JoFETs 102 and made in the semiconductor substrate 104, and also comprising an Andreev chain 206 made from superconductor regions 208 obtained for example by the implementation of the steps making the second regions 114 of the JoFETs 102.

Figure 36:
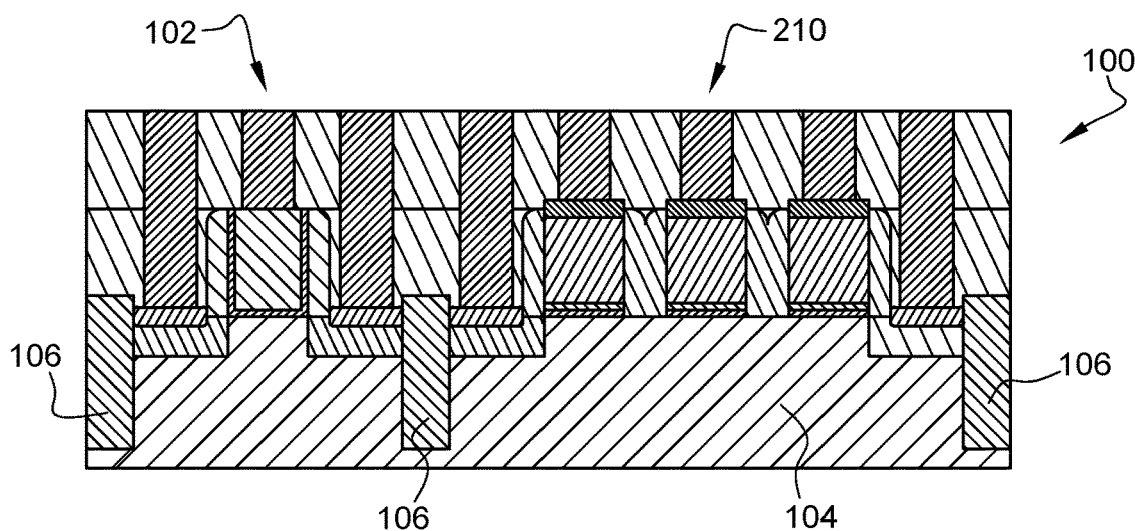

According to another example, FIG. 36 shows a device 100 comprising one or more superconductor qubit(s) including at least one JoFET 102 (one single JoFET 102 is visible in FIG. 36) made in the semiconductor substrate 104, and also comprising devices 210 with spin qubits.

The invention claimed is:

1. A method for carrying out an electronic device with superconductor qubit(s) including at least one JoFET formed by the implementation of the steps of:
    making, over at least one semiconductor layer, at least one protective dielectric portion arranged over at least one first region of the semiconductor layer;
    implanting dopants in second regions of the semiconductor layer, adjacent to the first region and such that the first region is arranged between the second regions;
    depositing a protective dielectric layer covering at least the protective dielectric portion and the second regions;
    exposing the protective dielectric layer to at least one laser pulse;
    removing at least one portion of the protective dielectric layer covering the second regions;
    removing the protective dielectric portion;
    making at least one electrostatic control gate over the first region;
and wherein the materials and the thicknesses of the protective dielectric portion and of the protective dielectric layer, as well as the duration and the power of said at least one laser pulse, are selected such that the superposition of the protective dielectric portion and of the protective dielectric layer over the first region prevents said at least one laser pulse from reaching the first region, and that the presence of the protective dielectric layer alone over the second regions enables said at least one laser pulse to reach the second regions and melt the semiconductor of the second regions which forms, after cooling, a recrystallised semiconductor material having superconductor material properties.

2. The method according to claim 1, wherein the protective dielectric portion includes SiN, and wherein the protective dielectric layer includes at least one of: SiN, SiCo, $SiO_2$.

3. The method according to claim 1, wherein the selection of the materials and of the thicknesses of the protective dielectric portion and of the protective dielectric layer is carried out:
    by selecting the material and the thickness of the protective dielectric layer such that the protective dielectric layer has a reflectivity, for the wavelength of said at least one laser pulse, lower than or equal to 15%, then
    by selecting the material and the thickness of the protective dielectric portion such that the superposition of the protective dielectric portion and of the protective dielectric layer has a reflectivity, for the wavelength of said at least one laser pulse, higher than or equal to 50%.

4. The method according to claim 1, wherein:
    the protective dielectric layer is conformally deposited, and
    the removal of at least one portion of the protective dielectric layer covering the second regions is carried out by implementing an anisotropic etching of the protective dielectric layer such that remaining portions of the protective dielectric layer form lateral dielectric spacers arranged against sidewalls of the protective dielectric portions.

5. The method according to claim 1, further including, between the making of the protective dielectric portion and the implantation of the dopants in the second regions:
    conformal deposition of a second dielectric layer covering at least the protective dielectric portion and the second regions;
    anisotropic etching of the second dielectric layer such that remaining portions of the second dielectric layer cover sidewalls of the protective dielectric portion and are arranged over the first region;
    a semiconductor epitaxy over the second regions;
and wherein the deposited protective dielectric layer also covers the remaining portions of the second dielectric layer.

6. The method according to claim 5, wherein:
    the protective dielectric layer is conformally deposited, and the removal of at least one portion of the protective dielectric layer covering the second regions is carried out by implementing an anisotropic etching of the protective dielectric layer, remaining portions of the protective dielectric layer forming, with the remaining portions of the second dielectric layer, lateral dielectric spacers arranged against sidewalls of the protective dielectric portion, or
    the removal of at least one portion of the protective dielectric layer corresponds to a total removal of the protective dielectric layer.

7. The method according to claim 1, further including, between the making of the protective dielectric portion and the implantation of the dopants in the second regions:

conformal deposition of a third dielectric layer covering at least the protective dielectric portion and the second regions, and whose thickness is equal at least to that of the protective dielectric layer formed subsequently;

anisotropic etching of the third dielectric layer such that remaining portions of the third dielectric layer cover sidewalls of the protective dielectric portion and are arranged over the first region;

and further including, between the implantation of the dopants in the second regions and the deposition of the protective dielectric layer, a removal of the remaining portions of the third dielectric layer.

8. The method according to claim 7, further including, between the removal of at least one portion of the protective dielectric layer covering the second regions and the removal of the protective dielectric portion, making of lateral dielectric spacers against remaining portions of the protective dielectric layer, and wherein the making of the electrostatic control gate is preceded by a removal of the remaining portions of the protective dielectric layer.

9. The method according to claim 1, wherein the semiconductor layer corresponds to a superficial layer of a semiconductor-on-insulator type substrate.

10. The method according to claim 9, wherein the dopants are implanted within all the thickness of the semiconductor layer, or wherein the dopants are implanted within only one portion of the thickness of the semiconductor layer.

11. The method according to claim 1, wherein the dopants correspond to boron atoms implanted with a dose between $1.10^{16}$ and $9.10^{17}$ at/cm$^2$.

12. The method according to claim 1, further including, before the making of the protective dielectric portion, the making of isolation trenches through at least one portion of the thickness of the semiconductor layer, and wherein the steps implemented afterwards form several JoFETs electrically isolated from each other by the isolation trenches.

13. The method according to claim 1, wherein the implemented steps form several JoFETs electrically coupled in series via second regions common to two of said JoFETs.

14. The method according to claim 1, further including the making, in the semiconductor layer, of devices with spin qubits and/or CMOS-type devices and/or at least one Andreev chain including other regions of a recrystallised semiconductor having superconductor material properties.

* * * * *